United States Patent
Schlezinger et al.

(10) Patent No.: US 10,507,991 B2
(45) Date of Patent: Dec. 17, 2019

(54) VACUUM CONVEYOR SUBSTRATE LOADING MODULE

(71) Applicant: Applied Materials, Inc., Santa Clara, CA (US)

(72) Inventors: Asaf Schlezinger, Sunnyvale, CA (US); Markus J. Stopper, Voerstetten (DE)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 16/031,656

(22) Filed: Jul. 10, 2018

(65) Prior Publication Data

US 2019/0344980 A1 Nov. 14, 2019

Related U.S. Application Data

(60) Provisional application No. 62/668,554, filed on May 8, 2018.

(51) Int. Cl.
*B65G 47/91* (2006.01)
*H02S 50/10* (2014.01)
*H01L 31/18* (2006.01)

(52) U.S. Cl.
CPC .......... *B65G 47/917* (2013.01); *H01L 31/18* (2013.01); *H02S 50/10* (2014.12)

(58) Field of Classification Search
CPC .......... B65H 2301/44734; B65H 2301/44735; B65H 2406/323; B65H 29/242;
(Continued)

(56) References Cited

U.S. PATENT DOCUMENTS 3,545,631 A * 12/1970 Chivas ............... B65G 21/2036
271/12
3,599,967 A * 8/1971 Rapparlie ................ B07C 1/04
271/12
(Continued)

FOREIGN PATENT DOCUMENTS

JP 04-121334 A 4/1992
JP H06-048607 A 2/1994
(Continued)

OTHER PUBLICATIONS

PCT Notification of Transmittal of the International Search Report and the Written Opinion of the International Searching Authority; for International Application No. PCT/US2016/026035; dated Jun. 30, 2016; 11 total pages.
(Continued)

*Primary Examiner* — William R Harp
(74) *Attorney, Agent, or Firm* — Patterson + Sheridan LLP

(57) ABSTRACT

A method and apparatus for loading substrates in an inspection station is disclosed herein. In one embodiment a loading module for a substrate inspection system is provided that includes a first conveyor module, and a second conveyor module having a movable surface positioned substantially parallel to a movable surface of the first conveyor module, wherein the first conveyor module includes a first section and a second section, the first section having a vacuum unit operable to secure a substrate to a portion of the movable surface in the first section, and the second section is configured to release the substrate from the movable surface.

20 Claims, 3 Drawing Sheets

(58) Field of Classification Search
CPC .... B65H 29/32; B65H 5/224; B65G 21/2036; B65G 15/58; B65G 47/91
USPC .................. 198/689.1, 811; 414/797, 797.2
See application file for complete search history.

(56) References Cited

U.S. PATENT DOCUMENTS

| | | | |
|---|---|---|---|
| 3,830,489 A * | 8/1974 | Adams | B65H 3/126 |
| | | | 271/9.12 |
| 4,635,921 A * | 1/1987 | Thomas | B65H 3/14 |
| | | | 221/211 |
| 4,753,162 A | 6/1988 | Bubley | |
| 6,309,116 B1 | 10/2001 | Mahara et al. | |
| 7,007,940 B2 * | 3/2006 | Polidoro | B65H 3/08 |
| | | | 271/11 |
| 7,007,942 B1 * | 3/2006 | Stearns | B65H 3/08 |
| | | | 271/108 |
| 7,959,401 B2 * | 6/2011 | Trejo | B65G 47/082 |
| | | | 198/803.5 |
| 9,834,402 B2 * | 12/2017 | Sachs | B65B 57/14 |
| 2011/0008145 A1 | 1/2011 | Huber | |
| 2012/0109355 A1 | 5/2012 | Baccini et al. | |
| 2013/0079913 A1 | 3/2013 | Oza et al. | |
| 2014/0294544 A1 | 10/2014 | Rebstock | |
| 2016/0325946 A1 | 11/2016 | Stopper et al. | |

FOREIGN PATENT DOCUMENTS

| | | |
|---|---|---|
| JP | 2010-064024 A | 3/2010 |
| JP | 2012-028551 A | 2/2012 |
| KR | 2010-0033283 A | 3/2010 |
| KR | 2011-0095023 A | 8/2011 |
| KR | 2013-0020103 A | 2/2013 |

OTHER PUBLICATIONS

Korean Office Action for Application No. 10-2016-7031005; dated Apr. 18, 2017; 9 total pages.
European Patent Office; Extended European Search Report for Application 16785079.1-1551; dated Nov. 14, 2017; 7 total pages.
Japanese Office Action (with attached English translation) for Application No. 2016-566640; dated Dec. 14, 2017; 6 total pages.
International Search Report and Written Opinion for Application No. PCT/US2019/019433 dated Jun. 14, 2019.

* cited by examiner

VACUUM CONVEYOR SUBSTRATE LOADING MODULE

CROSS-REFERENCE TO RELATED APPLICATION

This application claims benefit of U.S. Provisional Patent Application Ser. No. 62/668,554, filed May 8, 2018, which application is incorporated by reference herein.

FIELD

Embodiments of the present disclosure generally relate to substrate loading equipment. More specifically, embodiments disclosed herein relate to a system and method for loading substrates into solar substrate inspection equipment using a vacuum conveyor.

BACKGROUND

Substrates, such as substrates including a plurality of photovoltaic devices formed thereon, that are utilized as solar panels, are routinely inspected during processing at independent inspection stations to ensure compliance with predetermined quality control standards. Different inspection techniques provide comprehensive data regarding products and processes. However, comprehensive inspections can be time consuming, thus reducing throughput, due to the number of inspection stations required and the resulting transfer time of moving substrates therebetween. Thus, device manufacturers are often faced with the decision of choosing between thorough inspection stations with burdensome inspection/transfer times, or foregoing certain inspection processes.

However, as inspection processes have continued to decrease the amount of time required to complete required inspection steps, loading apparatuses also need to be improved to be able to keep up with the increased throughput.

Thus, there is a need for an improved substrate loading apparatus for use with inspection systems.

SUMMARY

A method and apparatus for loading substrates in an inspection station is disclosed herein. In one embodiment a loading module for a substrate inspection system is provided that includes a first conveyor module, and a second conveyor module having a movable surface positioned substantially parallel to a movable surface of the first conveyor module, wherein the first conveyor module includes a first section and a second section, the first section having a vacuum unit operable to secure a substrate to a portion of the movable surface in the first section, and the second section is configured to release the substrate from the movable surface.

In another embodiment, a substrate inspection system is disclosed. The substrate inspection system includes a first conveyor module, a second conveyor module having a movable surface positioned substantially parallel to a movable surface of the first conveyor module, wherein the first conveyor module includes a first section and a second section, the first section having a vacuum unit, the vacuum unit being operable to secure a substrate to a portion of the movable surface in the first section, and the second section is configured to release the substrate from the movable surface, and a third conveyor module, wherein the first conveyor module and the second conveyor module are positioned at and an angle relative to a plane of a movable surface of the third conveyor module.

In another embodiment, a substrate inspection system is disclosed. The inspection system includes a loading module coupled to an inspection chamber. The loading module includes a first conveyor module, a second conveyor module having a movable surface positioned substantially parallel to a movable surface of the first conveyor module, wherein the first conveyor module includes a first section and a second section, the first section having a vacuum unit operable to secure a substrate to a portion of the movable surface in the first section, and the second section is configured to release the substrate from the movable surface, and a third conveyor module, wherein the first conveyor module and the second conveyor module are positioned at and an acute angle relative to a plane of a movable surface of the third conveyor module.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

For clarity, identical reference numerals have been used, where applicable, to designate identical elements that are common between figures. Additionally, elements of one embodiment may be advantageously adapted for utilization in other embodiments described herein.

DETAILED DESCRIPTION

Figure 1:
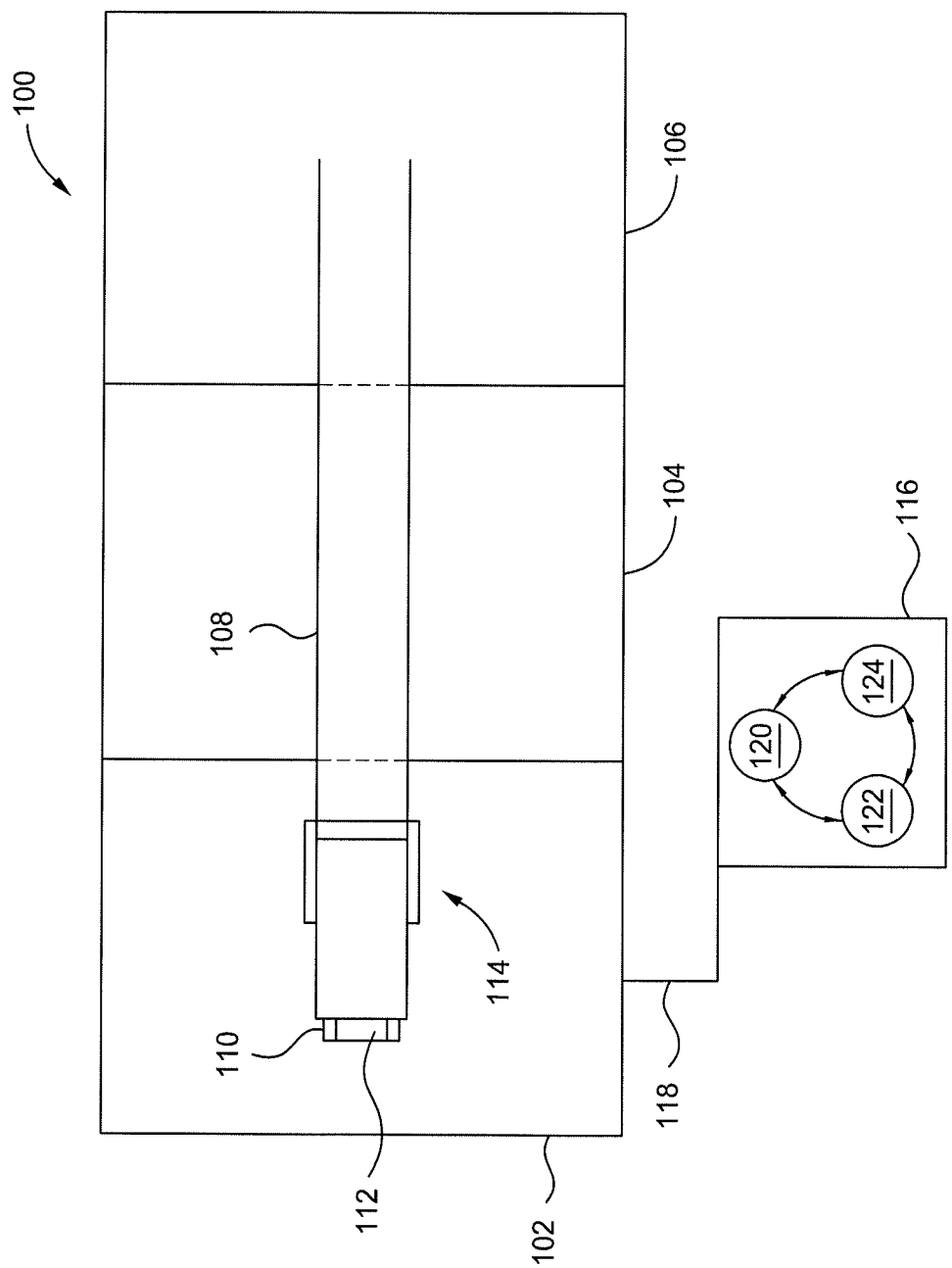
FIG. 1 illustrates a top plan view of a substrate inspection system, according to one embodiment.

FIG. 1 illustrates a top plan view of an inspection system 100 for inspecting substrates, according to one embodiment. The inspection system 100 includes a loading module 102, a modular inspection unit 104, and a sorting unit 106.

In one embodiment, the modular inspection unit 104 may include one or more metrology stations. The metrology stations may include, by way of example only, any of the following: a micro-crack inspection unit, a thickness measuring unit, a resistivity measuring unit, a photoluminescence unit, a geometry inspection unit, a saw mark detection unit, a stain detection unit, a chip detection unit, and/or a crystal fraction detection unit. The micro-crack inspection unit may be, by way of example only, configured to inspect substrates for cracks, as well as to optionally determine crystal fraction of a substrate. The geometry inspection unit may be configured, by way of example only, to analyze surface properties of a substrate. The saw mark detection unit may be configured, by way of example only, to identify saw marks including groove, step, and double step marks on a substrate. The metrology stations may also include other examples beyond those listed.

The loading module 102, the modular inspection unit 104, and the sorting unit 106 are connected in a linear arrangement such that a substrate may be easily and rapidly passed among the loading module 102, the modular inspection unit 104 and the sorting unit 106 by a conveyor system 108 without exiting the inspection system 100. The loading module 102 is configured to load substrates for transfer through the modular inspection unit 104 and the sorting unit 106 by the conveyor system 108. The conveyor system 108 conveys inspected substrates from the modular unit 104 towards the sorting unit 106. The conveyor system 108 may deliver inspected substrates into the sorting unit 106 to a location within reach of a rotary sorting system (not shown) housed with sorting unit 106. The sorting unit 106 generally includes a plurality of bins (not shown) where the inspected substrates may be sorted into the sorting bins in response to one or more substrate characteristics determined during one or more of the inspection processes performed in the modular inspection unit 104.

The loading module 102 receives a cassette 110 containing substrates 112 in a stacked configuration. Each cassette 110 includes a plurality of slots therein. Each slot is configured to hold a substrate 112. The cassette 110 may be positioned such that the substrates 112 are positioned one over the other. In another example, the substrates 112 may be positioned in a holder such that there is no gap between each substrate 112. The substrates 112 are transferred from the cassette 110 to the conveyor system 108 using a vacuum conveyor system 114 described in more detail in FIGS. 2 and 3 below. In one embodiment, the conveyor system 108 may be a continuous conveyor belt running through the inspection system 100. In another embodiment, the conveyor system 108 may include more than one conveyor belt running through the inspection system 100. The one or more conveyor belts may be disposed sequentially in a linear arrangement to transfer substrates received in the loading module 102 to the modular inspection unit 104.

Due to throughput concerns in conventional systems, multiple rotatable pick and place devices are used to transfer substrates 112 to the conveyor system 108. Typically, the conventional systems can load about 5,000-6,000 substrates per hour using multiple pick and place devices. However, according to embodiments described herein, a single vacuum conveyor system 114 can increase the throughput to about 10,000 substrates per hour, which is a significant improvement in throughput over the conventional systems.

The inspection system 100 may further include a controller 116. The inspection system 100 is coupled to the controller 116 by a communication cable 118. The controller 116 is operable to control processing of substrates 112 within the inspection system 100. The controller 116 includes a programmable central processing unit (CPU) 120 that is operable with a memory 122 and a mass storage device, an input control unit, and a display unit (not shown), such as power supplies, clocks, cache, input/output (I/O) circuits, and the like, coupled to the various components of the inspection system 100 to facilitate control of the processes of handling and inspecting the substrates. The controller 116 may also include hardware for monitoring the processing of a substrate through sensors (not shown) in the inspection system 100.

To facilitate control of the inspection system 100 and processing a substrate, the CPU 120 may be one of any form of general-purpose computer processors for controlling the substrate process. The memory 122 is coupled to the CPU 120 and the memory 122 is non-transitory and may be one or more of readily available memory such as random access memory (RAM), read only memory (ROM), floppy disk drive, hard disk, or any other form of digital storage, local or remote. Support circuits 124 are coupled to the CPU 120 for supporting the CPU 120 in a conventional manner. The process for loading substrates by operation of the loading module 102 may be stored in the memory 122. The process for loading substrates may also be stored and/or executed by a second CPU (not shown) that is remotely located from the hardware being controlled by the CPU 120.

The memory 122 is in the form of computer-readable storage media that contains instructions, that when executed by the CPU 120, facilitates the operation of the inspection system 100. The instructions in the memory 122 are in the form of a program product such as a program that implements the operation of the inspection system 100, including for example the operation of the loading module 102. The program code may conform to any one of a number of different programming languages. In one example, the disclosure may be implemented as a program product stored in computer readable storage media for use with a computer system. The program(s) of the program product define functions of the embodiments. Illustrative computer-readable storage media include, but are not limited to: (i) non-writable storage media (e.g., read-only memory devices within a computer such as CD-ROM disks readable by a CD-ROM drive, flash memory, ROM chips or any tope of solid-state non-volatile semiconductor memory) on which information is permanently stored; and (ii) writing storage media (e.g. floppy disks within a diskette drive or hard-disk drive or any type of solid-state random-access semiconductor memory) on which alterable information is stored. Such computer-readable storage media, when carrying computer-readable instructions that direct the functions of the methods described herein, are embodiments of the present disclosure.

Figure 2:
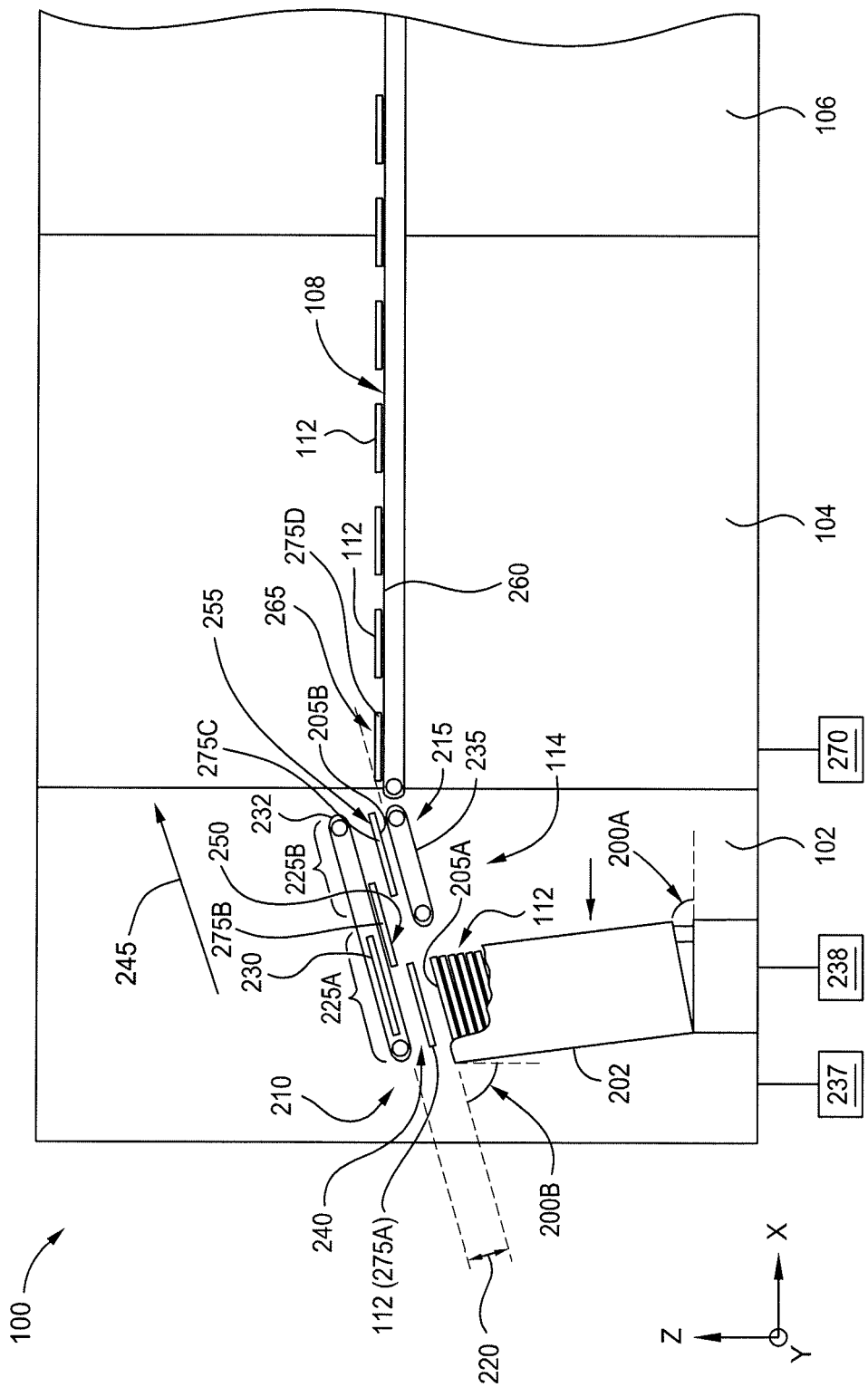
FIG. 2 is a schematic side view of a portion of the inspection system of FIG. 1.

FIG. 2 is a schematic side view of a portion of the inspection system 100 of FIG. 1. The vacuum conveyor system 114 is shown positioned above the cassette 110. The cassette 110 includes a plurality of stacked substrates 112. The cassette 110 is tilted at an angle 200A relative to a horizontal direction (the X/Y plane) such that edges of the substrates 112 in the cassette 110 are substantially aligned vertically against a sidewall 202 of the cassette 110. The tilt of the cassette 110 presents first (upper) major surfaces 205A of the stacked substrates 112 in an angle 200B relative to the vertical direction.

The vacuum conveyor system 114 includes a first conveyor module 210 and a second conveyor module 215. The first conveyor module 210 and the second conveyor module 215 are spaced apart vertically by a distance 220. The first conveyor module 210 includes a first section 225A and a second section 225B that both share an endless web or belt 232. The second conveyor module 215 also includes an endless web or belt 235. A drive motor 237 is coupled to the belt 232 that moves the belt 232 in a first direction. A drive motor 238 is coupled to the belt 235 that moves the belt 235 in a second direction that is opposite to the first direction. For example, the belt 232 may be driven by the drive motors 237 in a counterclockwise direction and the belt 235 may be driven in a clockwise direction by the drive motor 238. Thus, the surfaces of the belt 232 and the belt 235 move in the same direction shown as a first direction 245.

The first section 225A of the first conveyor module 210 includes a vacuum unit 230. The vacuum unit 230 lifts a substrate 112 from the cassette 110, which is shown as a lifted position 240. The first major surface 205A of the substrate 112 is held against the surface of the belt 232 by vacuum applied through the belt 232 by the vacuum unit 230. The substrate 112 is held against the belt 232 along the first section 225A and is moved by the belt 232 along the first direction 245. The first direction 245 is aligned with the angle 200B. The substrate 112 moving along the belt 232 is depicted in a moving position 250.

The second section 225B of the first conveyor module 210 does not include a vacuum unit. When the substrate 112 reaches or nears the second section 225B of the first conveyor module 210, vacuum is no longer applied through the belt 232 such that the substrate 112 detaches from the belt 232. The substrate 112 is depicted in a falling position 255. The substrate 112, in the falling position, is affected by gravity and moves toward the belt 235 of the second conveyor module 215. The falling position 255 is in the Z direction as well as in the first direction 245 due to momentum derived from the motion of the substrate 112 moving from the moving position 250 to the falling position 255. Eventually, a second (opposing) major surface 205B of the substrate 112 makes contact with the belt 235 of the second conveyor module 215. The second conveyor module 215 moves the substrate 112 in the direction 245 toward an endless web or belt 260 of the conveyor system 108 (e.g., a third conveyor module). The belt 235 and the belt 260 are positioned in proximity to each other such that the substrate 112 is transferred smoothly from the belt 235 to the belt 260. As the substrate 112 reaches the end of the belt 235, the substrate 112 is angled in the first direction 245 but eventually is positioned in an X/Y plane when greater than 50% of the substrate 112 is over the belt 260.

A plurality of substrates 112 previously transferred from the cassette 110 by the vacuum conveyor system 114 is shown on the belt 260 in an inspection position 265. The inspection position 265 (e.g., a major surface of the substrate 112 and/or the belt 260) is a horizontal orientation (in the X/Y plane). The belt 260 is coupled to a drive motor 270 that drives the belt 260 in the second direction (e.g., clockwise).

While the operation of the vacuum conveyor system 114 has been described above showing various positions of one of the substrates 112 in order to provide a detailed understanding of the disclosure, the vacuum conveyor system 114 would continually take substrates 112 from the cassette 110 and provide the substrates 112 to the conveyor system 108. For example, a first substrate 275A may be in the lifted position 240 as a second substrate 275B is in the moving position 250. Simultaneously, a third substrate 275C may be in the falling position 255 while a fourth substrate 275D is in the inspection position 265. The cycle continues at a pace that provides a throughput of up to about 10,000 substrates per hour. As substrates 112 are removed from the cassette 110, the cassette 110 moves remaining substrates 112 upward toward the first conveyor module 210 such that the uppermost substrate is within a distance such that vacuum from the vacuum unit 230 can remove the uppermost substrate from the cassette 110. For example, the cassette 110 may be coupled to a motor or a spring device that moves the remaining substrates in the cassette 110 upward as substrates 112 are removed.

As discussed above, the first conveyor module 210 and the second conveyor module 215 are separated by the distance 220. The distance 220 is substantially equal along the first direction 245 such that a movable surface of the belt 232 that faces a movable surface of the belt 235 is substantially parallel. The phrase "substantially parallel" means less than 10 degrees difference between the surfaces of the belts 232 and 235).

Figures 3, 4:
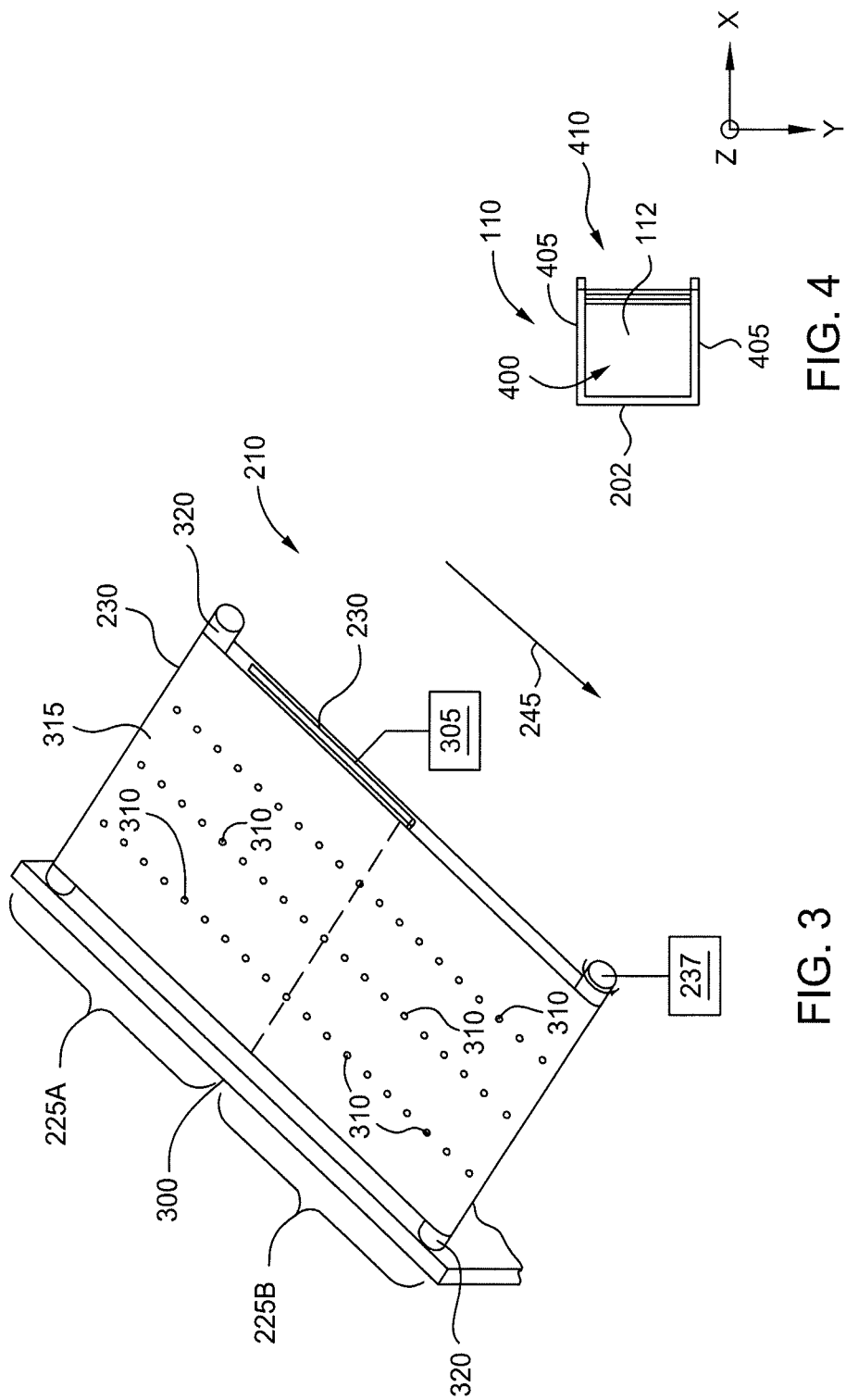
FIG. 3 is an isometric bottom view of the first conveyor module.
FIG. 4 is a top plan view of the cassette as seen from underside of the first conveyor module of FIG. 2.

FIG. 3 is an isometric bottom view of the first conveyor module 210. The first conveyor module 210 includes a support member 300 that is utilized to mount the first conveyor module 210 to the loading module 102 (shown in FIGS. 1 and 2). The vacuum unit 230 is shown adjacent to the belt 232 within the first section 225A of the first conveyor module 210. The vacuum unit 230 is fluidly coupled to a pump 305 that facilitates application of a negative pressure (i.e., vacuum) to holes or perforations 310 formed in the belt 232. However, due to the positioning of the vacuum unit 230, negative pressure is only provided when the perforations 310 are adjacent to the vacuum unit 230 in the first section 225A. For example, as the belt 232 moves in the first direction 245, the perforations 310 move from the first section 225A to the second section 225B and no negative pressure is applied to the perforations 310 when the belt 232 is in the second section 225B. Thus, when a substrate is adjacent to the belt 232 in the first section 225A, the vacuum unit 230 pulls the substrate against a surface 315 of the belt 232, and the substrate moves with the belt 232 in the first direction 245. When the substrate moves with the belt 232 onto the second section 225B, negative pressure is no longer applied to the perforations 310 now residing in the second section 225B. Consequently, the lack of vacuum force in the second section 225B allows the substrate to fall away from the belt 232, as described above with reference to FIG. 2. The perforations 310 may be formed through the belt 232 in rows as shown, or in another pattern. Thus, one substrate is picked up by the first section 225A while another substrate is simultaneously released from the belt 232 in the second section 225B without interrupting the motion of the belt 232 or the application of vacuum.

The belt 232 is supported on at least two rollers 320 positioned at opposing ends of the first conveyor module 210. The drive motor 237 is operably coupled to one of the rollers 320 to move the belt 232 in the first direction as described above.

FIG. 4 is a top plan view of the cassette 110 as seen from underside of the first conveyor module 210 of FIG. 2 (e.g., as the cassette 110 faces the surface 315 of the belt 232 (shown in FIG. 3)). The cassette 110 includes an open top 400. The cassette 110 also includes the sidewall 202 as well as two adjacent sides 405 coupled thereto to form an open side 410. The open top 400 provides unrestricted access for the first conveyor module 210 to access the substrates 112. The open side 410 allows unrestricted movement of substrates 112 in the X direction (for example when the substrates 112 are in the lifted position 240 as shown in FIG. 2).

It will be appreciated to those skilled in the art that the preceding examples are exemplary and not limiting. In some embodiments, the principles described herein are applicable to non-solar substrates, such as integrated circuit substrates. It is intended that all permutations, enhancements, equivalents, and improvements thereto that are apparent to those skilled in the art upon a reading of the specification and a study of the drawings are included within the true spirit and scope of the present disclosure. It is therefore intended that the following appended claims include all such modifications, permutations, and equivalents as fall within the true spirit and scope of these teachings.

What is claimed is:

1. A loading module for a substrate inspection system, the loading module comprising:
   a first conveyor module; and
   a second conveyor module having a movable surface positioned substantially parallel to a movable surface of the first conveyor module, wherein the first conveyor module includes a first section and a second section, the first section having a vacuum unit operable to secure a substrate to a portion of the movable surface in the first section, and the second section is configured to release the substrate from the movable surface of the first conveyor module in a falling position that is at an acute angle relative to a horizontal plane.

2. The loading module of claim 1, wherein the movable surfaces of both of the first conveyor module and the second conveyor module include a corresponding belt.

3. The loading module of claim 2, wherein the belt of the first conveyor module includes a plurality of holes formed therethrough.

4. The loading module of claim 2, wherein a drive motor coupled to the belt of the first conveyor module is configured to move the belt in a first rotational direction and a drive motor coupled to the belt of the second conveyor module is configured to move the belt in a second rotational direction that is opposite to the first rotational direction.

5. The loading module of claim 1, wherein the first conveyor module is positioned in an opposing relationship to the second conveyor module.

6. A substrate inspection system, comprising:
a first conveyor module;
a second conveyor module having a movable surface positioned opposite to and substantially parallel to a movable surface of the first conveyor module, wherein the first conveyor module includes a first section and a second section, and wherein only the first section includes a vacuum unit operable to secure a substrate to a portion of the movable surface in the first section, and the second section is configured to release the substrate from the movable surface of the first conveyor module; and
a third conveyor module, wherein the first conveyor module and the second conveyor module are positioned at an acute angle relative to a plane of a movable surface of the third conveyor module.

7. The substrate inspection system of claim 6, wherein the third conveyor module includes a movable surface, and the movable surfaces of each of the first conveyor module, the second conveyor module, and the third conveyor module include a corresponding belt.

8. The substrate inspection system of claim 7, wherein each of the belts are operably coupled to a drive motor.

9. The substrate inspection system of claim 8, wherein the drive motor coupled to the belt of the first conveyor module is configured to move the belt in a first rotational direction and the drive motor coupled to the belt of the second conveyor module is configured to move the belt in a second rotational direction that is opposite to the first rotational direction.

10. The substrate inspection system of claim 9, wherein the drive motor coupled to the belt of the third conveyor module is configured to move the belt in the second rotational direction.

11. The substrate inspection system of claim 7, wherein the belt of the first conveyor module includes a plurality of holes formed therethrough.

12. A substrate inspection system, comprising:
a loading module coupled to an inspection unit, the loading module comprising:
a first conveyor module;
a second conveyor module having a movable surface positioned substantially parallel to a movable surface of the first conveyor module, wherein the first conveyor module includes a first section and a second section, and wherein only the first section includes a vacuum unit operable to secure a substrate to a portion of the movable surface in the first section, and the second section is configured to release the substrate from the movable surface of the first conveyor module in a falling position that is at an acute angle relative to a horizontal plane; and
a third conveyor module, wherein the first conveyor module and the second conveyor module are positioned at an angle relative to a plane of a movable surface of the third conveyor module.

13. The inspection system of claim 12, wherein the first conveyor module is positioned above the second conveyor module, and the first conveyor module and the second conveyor module are positioned substantially parallel to each other.

14. The inspection system of claim 12, wherein the third conveyor module includes a movable surface, and the movable surfaces of each of the first conveyor module, the second conveyor module, and the third conveyor module include a corresponding belt.

15. The inspection system of claim 14, wherein each of the belts are operably coupled to a dedicated drive motor.

16. The inspection system of claim 15, wherein the drive motor coupled to the belt of the first conveyor module is configured to move the belt in a first rotational direction and the drive motor coupled to the belt of the second conveyor module is configured to move the belt in a second rotational direction that is opposite to the first rotational direction.

17. The inspection system of claim 16, wherein the drive motor coupled to the belt of the third conveyor module is configured to move the belt in the second rotational direction.

18. The inspection system of claim 14, wherein the belt of the first conveyor module includes a plurality of holes formed therethrough, the vacuum unit being configured to selectively apply negative pressure through the holes on the belt based on a position of the belt relative to the vacuum unit.

19. The inspection system of claim 12, further comprising a cassette including one or more substrates positioned therein, and each of the one or more substrates has a major surface positioned in a plane that is substantially parallel to the movable surface of the first conveyor module.

20. The inspection system of claim 12, wherein the plane of the movable surface of the third conveyor module is parallel to the horizontal plane.

* * * * *